United States Patent
Blaauw et al.

(10) Patent No.: US 9,385,692 B2
(45) Date of Patent: Jul. 5, 2016

(54) LOW POWER OSCILLATOR WITH CHARGE SUBTRACTION SCHEME

(71) Applicant: The Regents of The University of Michigan, Ann Arbor, MI (US)

(72) Inventors: David T. Blaauw, Ann Arbor, MI (US); Dennis Sylvester, Ann Arbor, MI (US); Seok Hyeon Jeong, Ann Arbor, MI (US)

(73) Assignee: The Regents Of The University Of Michigan, Ann Arbor, MI (US)

( * ) Notice: Subject to any disclaimer, the term of this patent is extended or adjusted under 35 U.S.C. 154(b) by 0 days.

(21) Appl. No.: 14/661,279

(22) Filed: Mar. 18, 2015

(65) Prior Publication Data
US 2015/0270804 A1    Sep. 24, 2015

Related U.S. Application Data

(60) Provisional application No. 61/954,738, filed on Mar. 18, 2014.

(51) Int. Cl.
| H03K 3/0231 | (2006.01) |
| H03K 4/502 | (2006.01) |
| H03K 3/012 | (2006.01) |
| H03K 3/011 | (2006.01) |

(52) U.S. Cl.
CPC ............... *H03K 3/0231* (2013.01); *H03K 3/011* (2013.01); *H03K 3/012* (2013.01); *H03K 4/502* (2013.01)

(58) Field of Classification Search
CPC ................ H03K 3/0231; H03K 3/354; H03K 4/50–4/502; H03K 3/011; H03K 3/012
USPC .................................................. 331/111, 143
See application file for complete search history.

(56) References Cited

U.S. PATENT DOCUMENTS

| 6,646,513 | B1 * | 11/2003 | Neidorff | .............. | H03K 3/0231 331/111 |
| 8,565,705 | B2 * | 10/2013 | Kousai | ................. | H03K 3/0231 331/108 C |

* cited by examiner

*Primary Examiner* — Ryan Johnson
(74) *Attorney, Agent, or Firm* — Harness, Dickey & Pierce, PLC

(57) ABSTRACT

An ultra-low power oscillator is designed for wake-up timers that can be used in compact wireless sensors, for example. A constant charge subtraction scheme removes continuous comparator delay from the oscillation period, which is the source of temperature dependence in conventional RC relaxation oscillators. This relaxes comparator design constraints, enabling low power operation. In 0.18 μm CMOS, the oscillator consumes 5.8 nW at room temperature with temperature stability of 45 ppm/° C. (−10° C. to 90° C.) and 1%/V line sensitivity.

17 Claims, 12 Drawing Sheets

$$T_{period} = Q_{const}/I_{REF} = CV_{REF}/I_{REF}$$

$T_{period} = Q_{const}/I_{REF} = CV_{REF}/I_{REF}$

LOW POWER OSCILLATOR WITH CHARGE SUBTRACTION SCHEME

CROSS-REFERENCE TO RELATED APPLICATIONS

This application claims the benefit of U.S. Provisional Application No. 61/954,738, filed Mar. 18, 2014. The entire disclosure of the above application is incorporated herein by reference.

GOVERNMENT CLAUSE

This invention was made with government support under CNS0910851 awarded by the National Science Foundation. The Government has certain rights in this invention.

FIELD

The present disclosure relates to ultra-low power oscillators.

BACKGROUND

Power consumption is a critical factor in the design of battery-powered compact wireless systems with volumes of 1 cm$^3$ or less. These systems often exhibit low duty cycles, making standby mode power a key concern. Wake-up timers are one of the few components that must remain powered on during standby mode. Hence, reducing their power consumption is vital while also maintaining accuracy to ensure proper time keeping.

Crystal oscillators are the conventional choice for wake-up timers due to their excellent temperature and frequency stability. However, they typically draw 100 s of nW and require an external component, driving up system volume. Alternatively, a number of relaxation-type oscillators can be entirely integrated on-chip using different approaches. In these approaches, a current source ($I_{REF}$) charges a capacitor ($C_{INT}$) that is then repeatedly reset using a continuous comparator, thereby generating an output frequency as seen FIGS. 1A and 1B. Even if the charging time ($C_{INT}V_{INT}/I_{REF}$) is perfectly temperature compensated, these methods have the key issue that the temperature-dependent comparator and buffer delays ($t_d$) impact the clock period.

A simple way to address this issue is to improve the comparator and clock buffer bandwidth so that their delays are negligible relative to the overall period. However, this leads to high power consumption. Instead, chopping can be used to reduce frequency error due to comparator offset while a feed-forward period control technique can be used to remove comparator and buffer delays. While these approaches achieve high accuracy (14 to 104 ppm/° C. in the kHz range), they consume 120 nW to 4.5 µW, which is high for standby power in compact wireless sensors.

Alternatively, comparator and buffer delays can be made negligible by slowing the clock frequency to the Hz range, using very low gate leakage for $I_{REF}$. While these oscillators consume sub-nW, gate leakage is highly temperature sensitive (≥375 ppm/° C.) and offers poor supply stability (≥40%/V), which is a critical drawback in battery-powered systems with often poor voltage regulation.

To avoid the fundamental trade-off between the temperature-dependent delay of the comparator and comparator power, the present disclosure introduces a novel constant charge subtraction scheme that completely eliminates comparator delay from the clock period. This section provides background information related to the present disclosure which is not necessarily prior art.

SUMMARY

This section provides a general summary of the disclosure, and is not a comprehensive disclosure of its full scope or all of its features.

A low power oscillator is presented. The oscillator includes: an integrating capacitor; a current source configured to charge the integrating capacitor; a subtraction circuit and at least one comparator. The subtraction circuit is electrically coupled to the integrating capacitor and operates to subtract a fixed amount of charge from the integrating capacitor in response to a trigger signal. A first comparator is configured to receive voltage across the integrating capacitor and compares the capacitor voltage to a first reference voltage. When the integrating capacitor voltage exceeds the first reference voltage, the first comparator provides a trigger signal to the subtraction circuit. The current source continues to charge the integrating capacitor while the subtraction circuit subtracts the fixed amount of charge from the integrating capacitor.

The low power oscillator may further include a second comparator and a control circuit. The control circuit counts occurrences of the trigger signal generated by the first comparator and generates an activation signal when the number of occurrences equals a predefined number of cycles. The second comparator is configured to receive voltage across the integrating capacitor and, in response to the activation signal, compares the capacitor voltage to a second reference voltage and outputs a pulse when the capacitor voltage exceeds the second reference voltage. After the pulse is output by the second comparator, the control circuit deactivates the second comparator. In this way, the output from the second comparator forms a periodic oscillating signal having a frequency based on the predefined number of cycles.

In another aspect of this disclosure, a method is provided for generating a periodic oscillating signal. The method includes: (a) charging an integrating capacitor using a current source; (b) comparing voltage across the capacitor to a first reference voltage using a first comparator circuit; (c) subtracting a fixed amount of charge from the integrating capacitor while continuing to charge the integrating capacitor, the subtraction occurring in response to the voltage across the integrating capacitor exceeding the first reference voltage; (d) incrementing a counter; and repeating steps (a)-(d) for a predefined number of cycles.

In response to value of the counter value equaling the predefined number of cycles, the second comparator is activated and the voltage across the integrating capacitor is compared to a second reference voltage using the second comparator circuit. In response to the voltage across the integrating capacitor exceeding the second reference voltage, a pulse is generated by the second comparator circuit.

Further areas of applicability will become apparent from the description provided herein. The description and specific examples in this summary are intended for purposes of illustration only and are not intended to limit the scope of the present disclosure.

BRIEF DESCRIPTION OF THE DRAWINGS

The present disclosure will become more fully understood from the detailed description and the accompanying drawings, wherein.

Figure 1A:
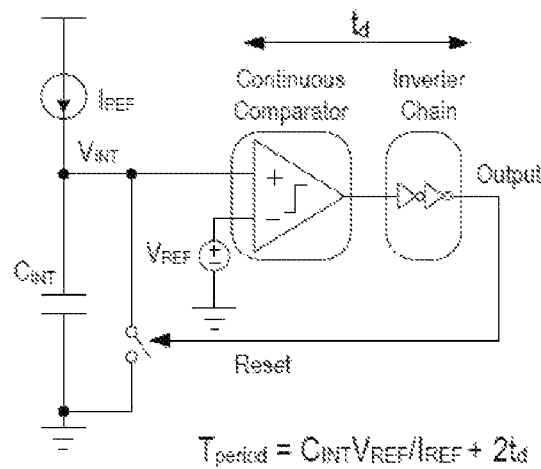
FIG. 1A is a schematic of a conventional oscillator.
Figure 1B:
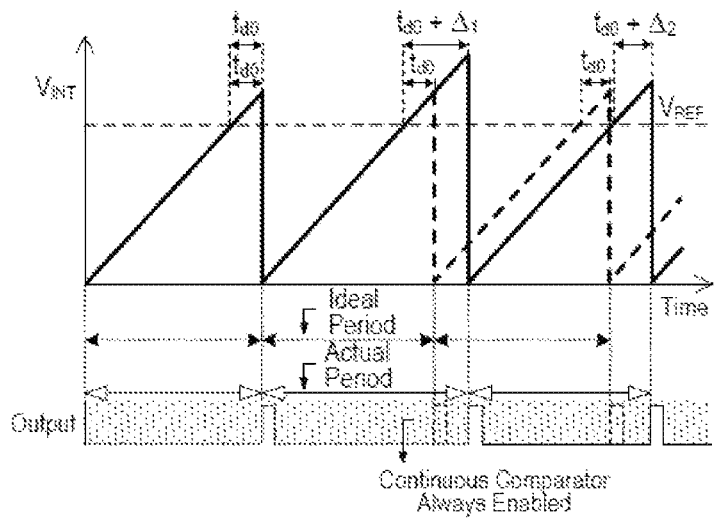
FIG. 1B is a timing diagram for the oscillator in FIG. 1A.

The drawings described herein are for illustrative purposes only of selected embodiments and not all possible implementations, and are not intended to limit the scope of the present disclosure. Corresponding reference numerals indicate corresponding parts throughout the several views of the drawings.

DETAILED DESCRIPTION

Figure 2A:
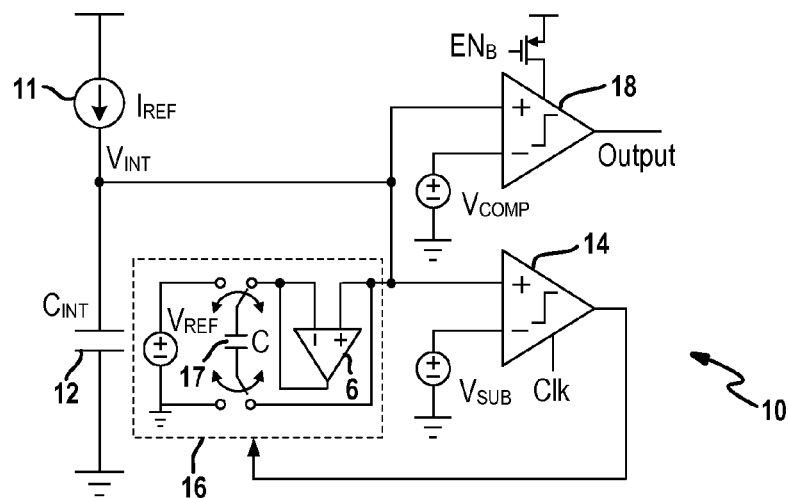
FIG. 2A is a schematic a low power oscillator according to the present disclosure.

FIG. 2A depicts a new oscillator topology in accordance with the present disclosure. The oscillator 10 is comprised generally of an integrating capacitor 12, a first coarse clocked comparator 14, a subtraction circuit 16, and a second duty-cycled continuous comparator 18. While reference is made to a particular circuit arrangement, other arrangements also fall within the broader aspects of this disclosure.

A current source 11 is configured to charge the integrating capacitor 12. The subtraction circuit 16 is electrically coupled to the integrating capacitor 12 and operates, in response to a trigger signal, to subtract a fixed amount of charge from the integrating capacitor 12. The first comparator 14 is configured to receive voltage across the integrating capacitor 12. The first comparator 14 compares the capacitor voltage to a first reference voltage and generates a trigger signal when the integrating capacitor voltage exceeds the first reference voltage. The trigger signal is in turn used by the subtraction circuit 16 to subtract a fixed amount of charge from the integrating capacitor 12. It is noted that the current source 11 continues to charge the integrating capacitor 12 while the subtraction circuit 16 subtracts the fixed amount of charge from the integrating capacitor 12.

In one embodiment, the subtraction circuit 16 includes a charging capacitor 17 that selectively couples to the integrating capacitor 12. In operation, the charging capacitor 17 is electrically coupled via an amplifier 6 to the integrating capacitor 12 while the subtraction circuit 16 subtracts the fixed amount of charge from the integrating capacitor 12 but is otherwise electrically isolated from the integrating capacitor 12.

A control circuit (not shown) counts occurrences of the trigger signal generated by the first comparator 14 and generates an activation signal (ENB) when the number of occurrences equals a predefined number of cycles. The second comparator 18 is also configured to receive voltage across the integrating capacitor 18. In response to the activation signal, the second comparator 18 compares the capacitor voltage to a second reference voltage and outputs a pulse when the capacitor voltage exceeds the second reference voltage. The control circuit deactivates the second comparator 18 after the pulse is output. In this way, the second comparator 18 primarily remains inactive, thereby reducing power consumption. The output from the second comparator 18 forms a periodic oscillating signal having a frequency based on the predefined number of cycles.

Figure 2B:
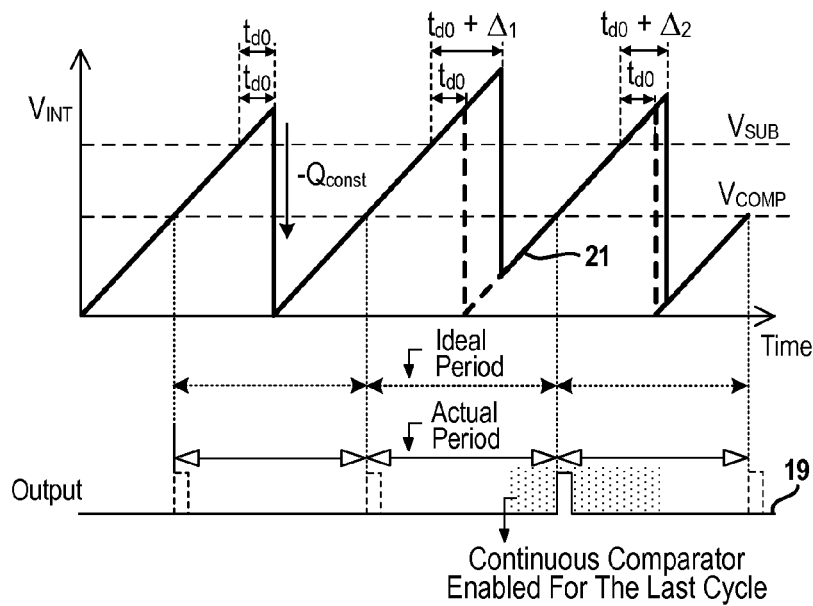
FIG. 2B is a timing diagram for the oscillator in FIG. 2A.

Operation of the oscillator 10 is better understood from the timing diagram in FIG. 2B. Instead of the conventional approach of fully discharging the integrating capacitor ($C_{INT}$), a constant amount of charge ($CV_{REF}$) is subtracted from charge stored by the integrating capacitor. The power-hungry continuous comparator is replaced with the first coarse, asynchronously clocked comparator 14 to detect the subtraction point ($V_{SUB}$). At every subtraction point, a constant amount of charge ($CV_{REF}$) is subtracted from $C_{INT}$ through an amplifier. Regardless of the subtraction time ($td0+\delta i$), this approach creates a sawtooth waveform that always rejoins the ideal sawtooth waveform as indicated at 21. Thus, the exact subtraction time does not impact the sawtooth waveform period and hence the clocked comparator can be slow and inaccurate, allowing its power to be reduced to ~100 pW. A counter tracks the number of subtraction cycles and triggers an accurate continuous comparator 18 for the last cycle only in order to generate a precise wake-up signal. With this scheme, an accurate wake-up signal 19 is generated while the oscillator 10 operates at ultra-low power for all but the last clock period. As a result, timer power consumption is 5.8 nW (average, for wakeup times >50 s) with a line sensitivity of 1%/V and temperature coefficient of 45 ppm/° C. It is envisioned that this ultra-low power oscillator 10 can be designed for wake-up timers that can be used in compact wireless sensors, for example.

Figure 3:
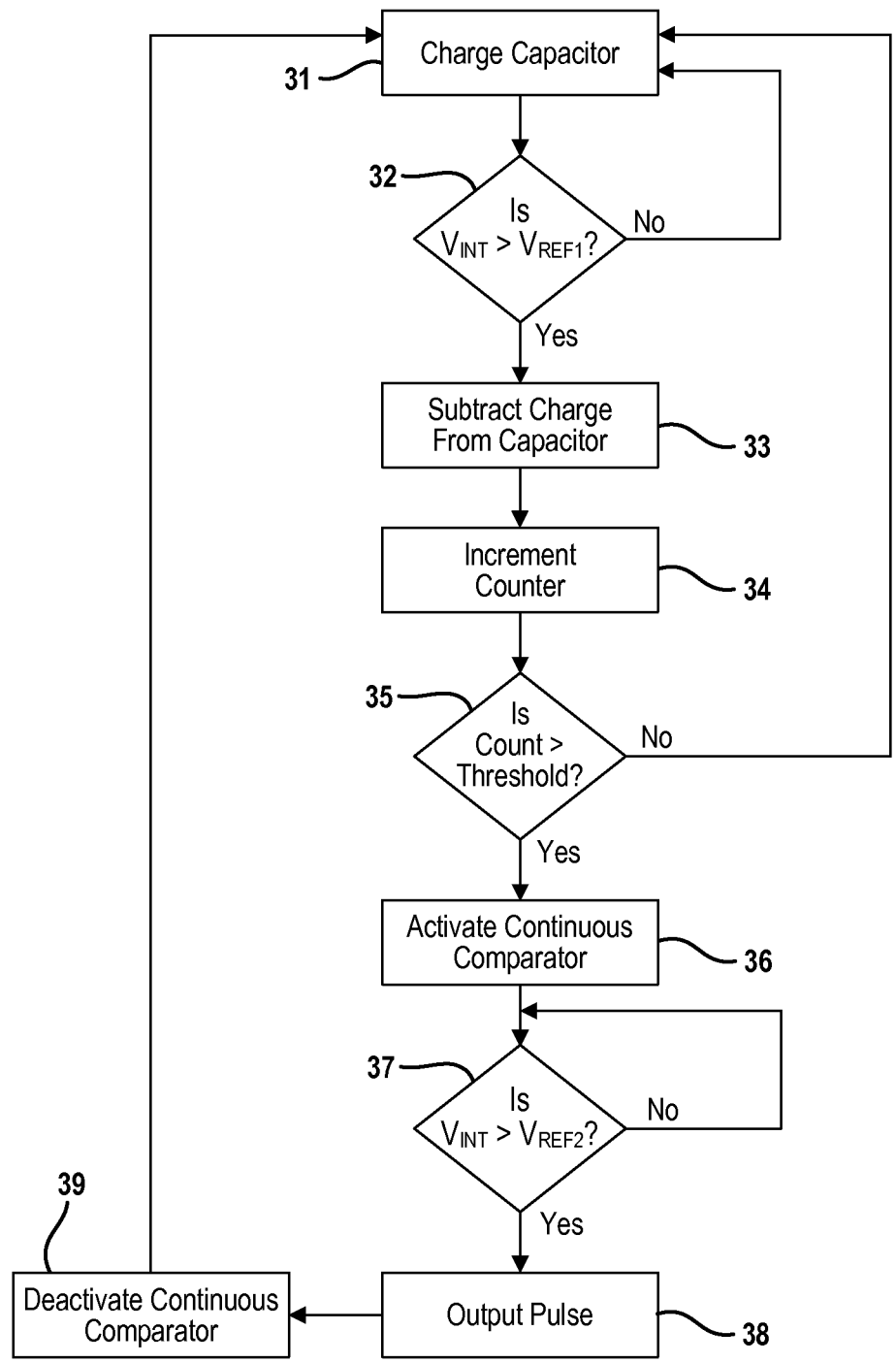
FIG. 3 is a flowchart illustrating the technique for generating a periodic oscillating signal employed by the oscillator in FIG. 2A.

This technique is generalized as seen in FIG. 3. An integrating capacitor is charged at 31, for example using a current source. Voltage across the capacitor is being compared at 32 to a first reference voltage, for example using a coarse clocked comparator. When the voltage across the integrating capacitor exceeds the first reference voltage, a fixed amount of charge is subtracted at 33 from the integrating capacitor and a counter is incremented at 34; otherwise, the voltage across the integrating capacitor continues to be monitored in relation to the first reference voltage. It is noted that the integrated capacitor continues to be charged while the subtraction operation is performed.

Value of the counter is also compared at 35 to a predefined number of cycles. When the counter value is less than the predefined number of cycles, the process continues at step 31. When the counter value equals (or exceeds) the predefined number of cycles, a second continuous comparator is activated as indicated at 36. The continuous comparator compares the voltage across the integrating capacitor to a second reference voltage at 37. When the voltage across the integrating capacitor exceeds the second reference voltage, a pulse is generated at 38 by the continuous comparator. After the pulse is output by the continuous comparator, the continuous comparator is deactivated and the process continues at step 31. In this way, a periodic oscillating signal is generated, where the frequency of the oscillating signal is defined by the value of the predefined number of cycles.

Figure 4A:
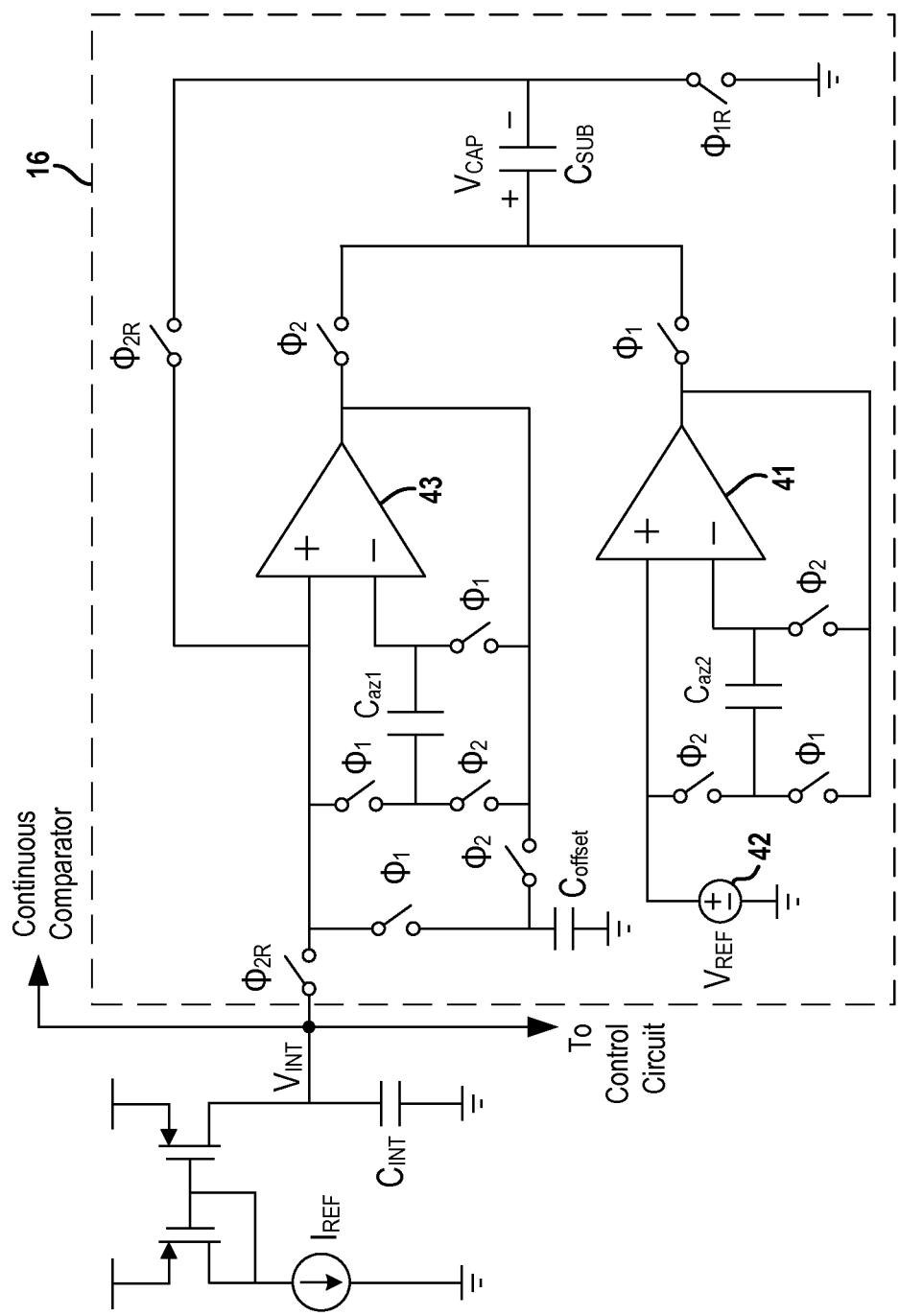
FIGS. 4A-4C are schematics depicting an example embodiment of a subtraction circuit.

FIGS. 4A-4D depict an example embodiment for the low power oscillator 10. The complete oscillator circuit 40 is shown in FIG. 4A. Initially, $C_{INT}$ is reset to ground using φ1R and φ2R rather than adding an additional device. This eliminates error coming from leakages, which is not negligible in low frequency applications, particularly at high temperatures (e.g., at 80° C. the leakage of a min-sized I/O device causes 0.51% error in period).

Figure 4C:
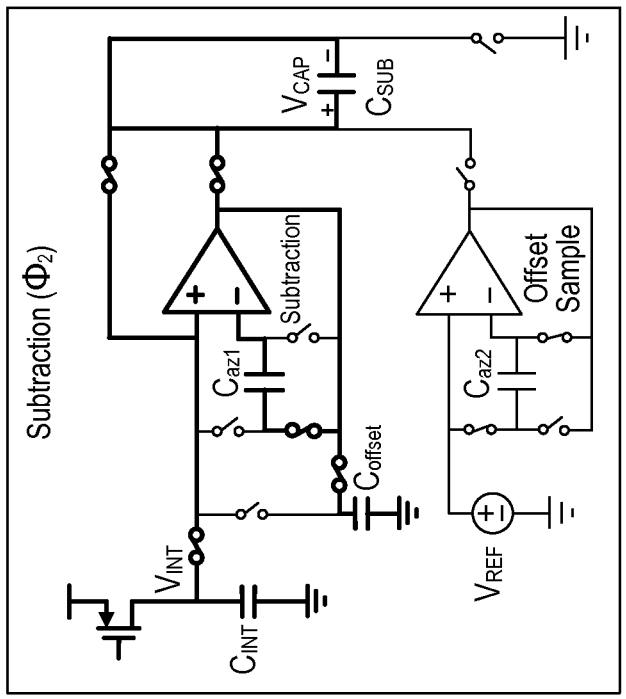
Figure 4B:
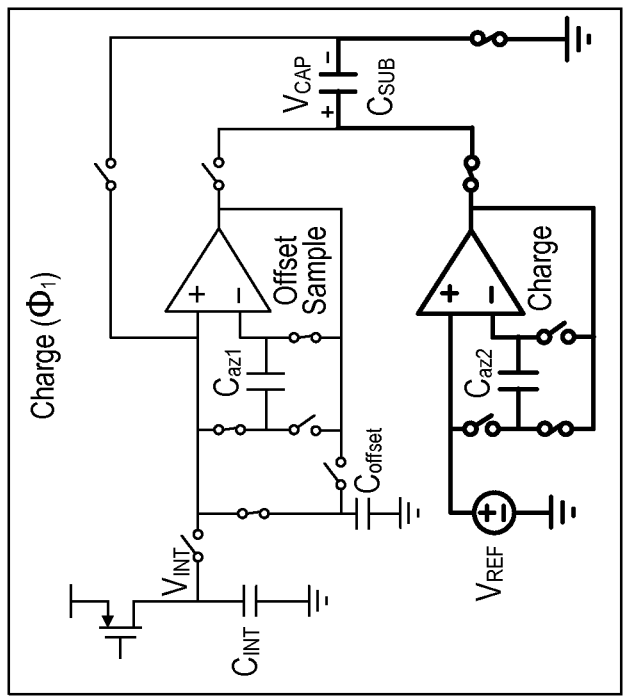
Figure 4D:
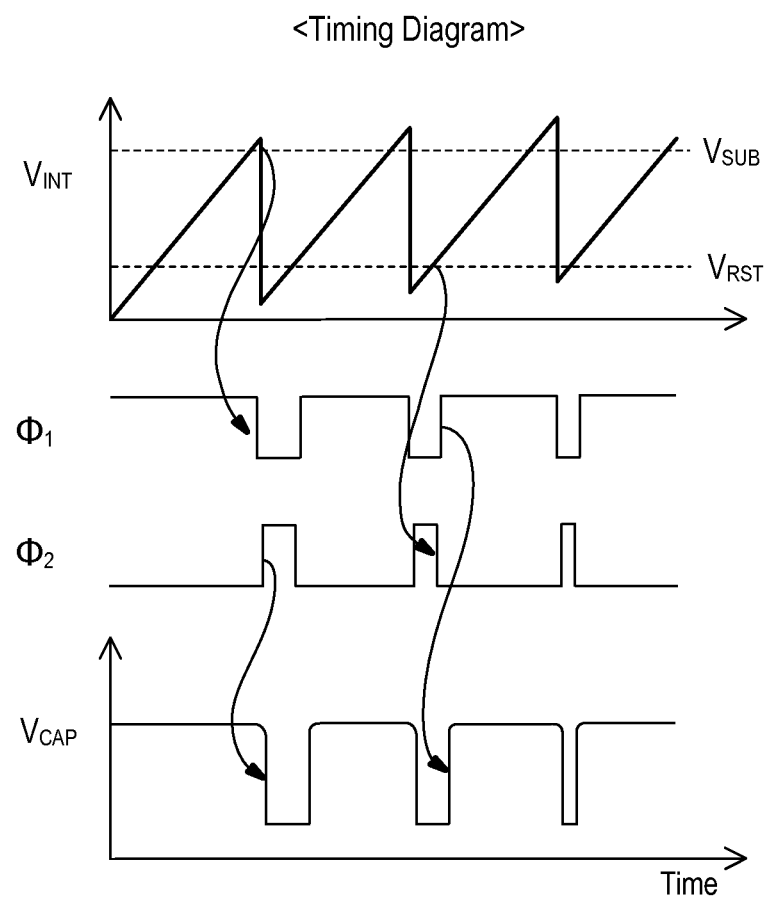
FIG. 4D is a timing diagram of the oscillator from FIG. 4A.

Following the initial reset, the scheme cycles through two main phases: a charging ($\phi_1$) phase and a subtraction ($\phi_2$) phase. For illustrative purpose, FIGS. 4B and 4C shows how the circuit operates during charging and subtraction phases, respectively.

In the charging $\phi_1$ phase, a subtraction capacitor ($C_{SUB}$) is connected to a voltage reference ($V_{REF}$) through a charging amplifier 41. A temperature-independent voltage source 42 charges the subtraction capacitor $C_{SUB}$ to a fixed voltage ($V_{REF}$). At the same time, a subtraction amplifier offset is stored on a capacitor $C_{az1}$. The integration capacitor ($C_{INT}$) is disconnected from the subtraction amplifier 43 to reduce the number of connected off-state switches, reducing leakage by 2.2× and improving timer error by 14 ppm/° C. in simulation. A temperature-compensated reference current ($I_{REF}$) charges up $C_{INT}$. When $V_{INT}$ exceeds a subtraction voltage ($V_{SUB}$), the subtraction phase ($\phi_2$) is triggered.

During the subtraction $\phi_2$ phase, the subtraction capacitor $C_{SUB}$ is disconnected from the charging amplifier 41 and connected to the integration capacitor $C_{INT}$ through the subtraction amplifier 43. The subtraction amplifier 43 subtracts charge stored in $C_{SUB}$ from $C_{INT}$. Simultaneously, an offset voltage of the charging amplifier 41 is stored on a capacitor $C_{AZ2}$ for the next phase. When $V_{INT}$ reaches a reset voltage ($V_{RST}$) after subtraction, the phase switches back to the charging phase $\phi_1$. A timing diagram of the charging and subtraction phases is presented in FIG. 4D.

In this example embodiment, since temperature dependency of amplifier gain can lead to error in the period, both charging and subtraction amplifiers are designed for open-loop gain of >78 dB with unity-gain bandwidth of 20 kHz in the targeted temperature range, resulting in period error <0.001%. The subtraction delay does not affect the overall period since $I_{REF}$ continues to accumulate charge on $C_{INT}$ during subtraction.

Figure 5:
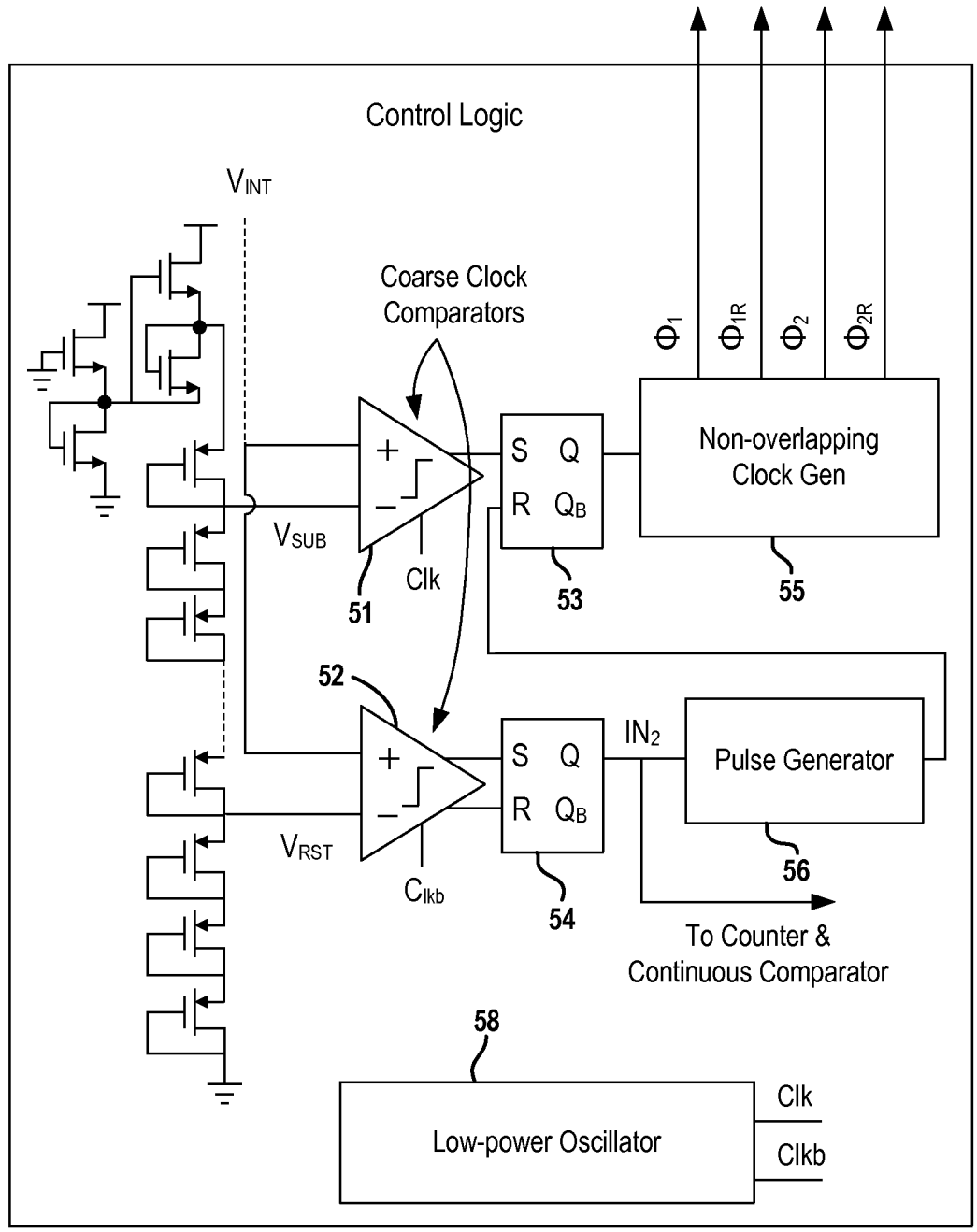
FIG. 5 is a schematic of an example embodiment of a control circuit for the oscillator.

FIG. 5 depicts an example embodiment for a control circuit 50. The control circuit 50 includes two comparators 51, 52, two latch circuits 53, 54, a clock generator 55 and a pulse generator 56. A four transistor voltage reference and diode stack 57 generates the two reference voltages, VSUB and VRST, for the two comparators 51, 52. Clock signals for the comparators 51, 52 are generated with a thyristor-based oscillator 58 that consumes 300 pW and operates at 700 Hz (25° C.). Its leakage-based operation makes the comparator clock sensitive to temperature and supply voltage. However, timer period is not impacted due to the constant charge subtraction scheme. Other implementations for the control circuit are also contemplated by this disclosure.

Figure 6A:
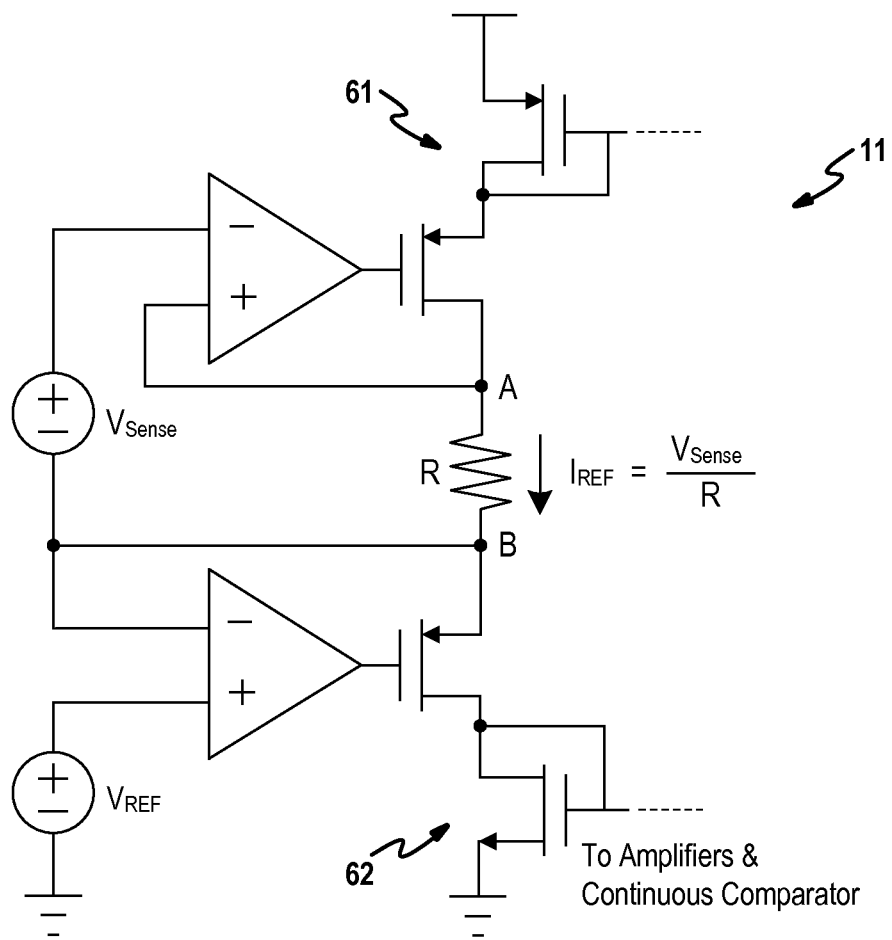
FIG. 6A is a schematic of an example embodiment for the reference current generator.

FIG. 6A depicts an example embodiment for the reference current source 11. The reference current (IREF) is generated using a temperature-to-voltage sensing element (Vsense) and a voltage to current (V-I) converter 61. The voltage drop across a resistor R is limited to <<100 mV by introducing a second V-I converter 62. In this example embodiment, the resistor shown R is a 5 MΩ p+ diffusion resistor.

Figure 6B:
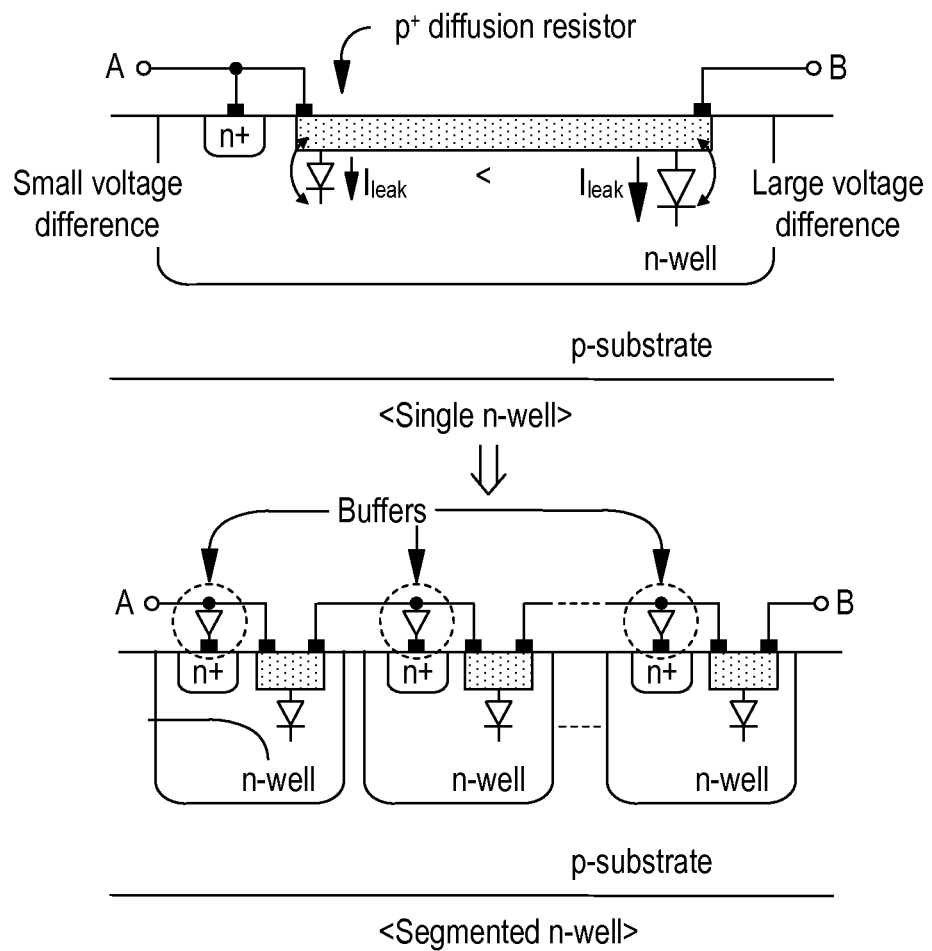
FIG. 6B is a diagram of a segmented resistor used by the reference current generator of FIG. 6A.
Figure 6C:
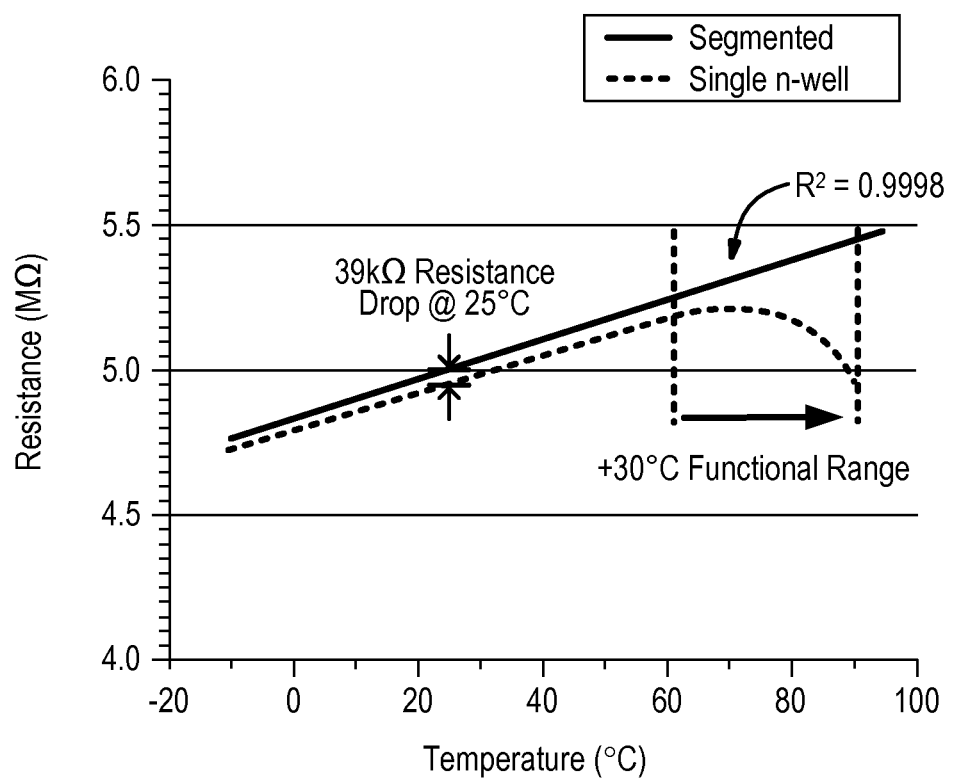
FIG. 6C is a graph showing resistance of the segmented resistor as a function of temperature.

In low current applications, junction leakage in the resistor degrades linearity at high temperature. In this case, only 2 nA flows through the 5 MΩ resistor nominally. Hence the 10x increase in junction leakage from 25° C. to 90° C. (to 212 pA) causes a non-negligible change in total resistor current. To minimize voltage differences, the resistor may be segmented as shown in FIG. 6B. Specifically, the resistor is segmented into separate n-wells that are tied to intermediate points to minimize their voltage differences. Furthermore, segmented n-wells are biased through buffers to isolate n-well to p-substrate leakage. Buffers are designed for 1 mV offset (10 k Monte Carlo simulations), limiting frequency error below 0.02%. Through this technique the functional temperature range increases by 30° C. for a 6.1% area penalty as seen in FIG. 6C.

Figure 7A:
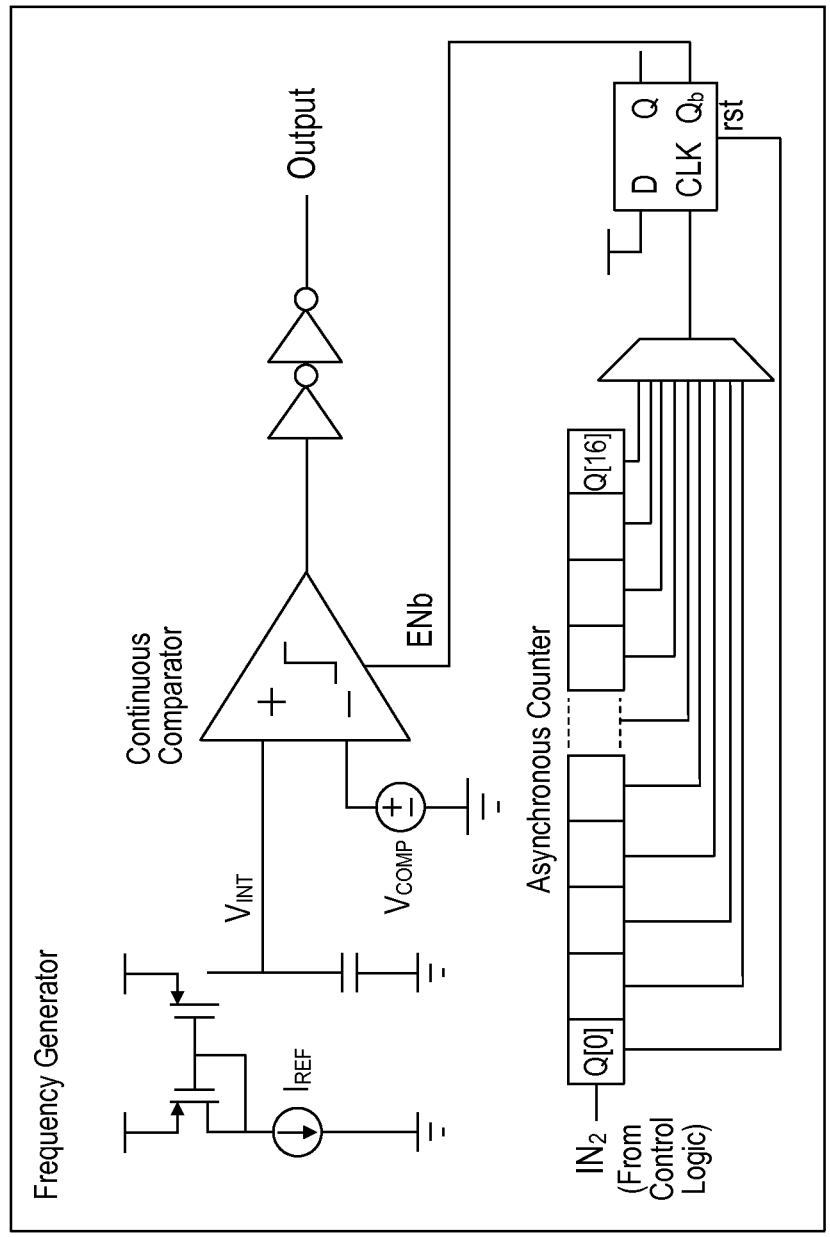
FIG. 7A is a schematic of an example programmable wake-up signal generator.
Figure 7B:
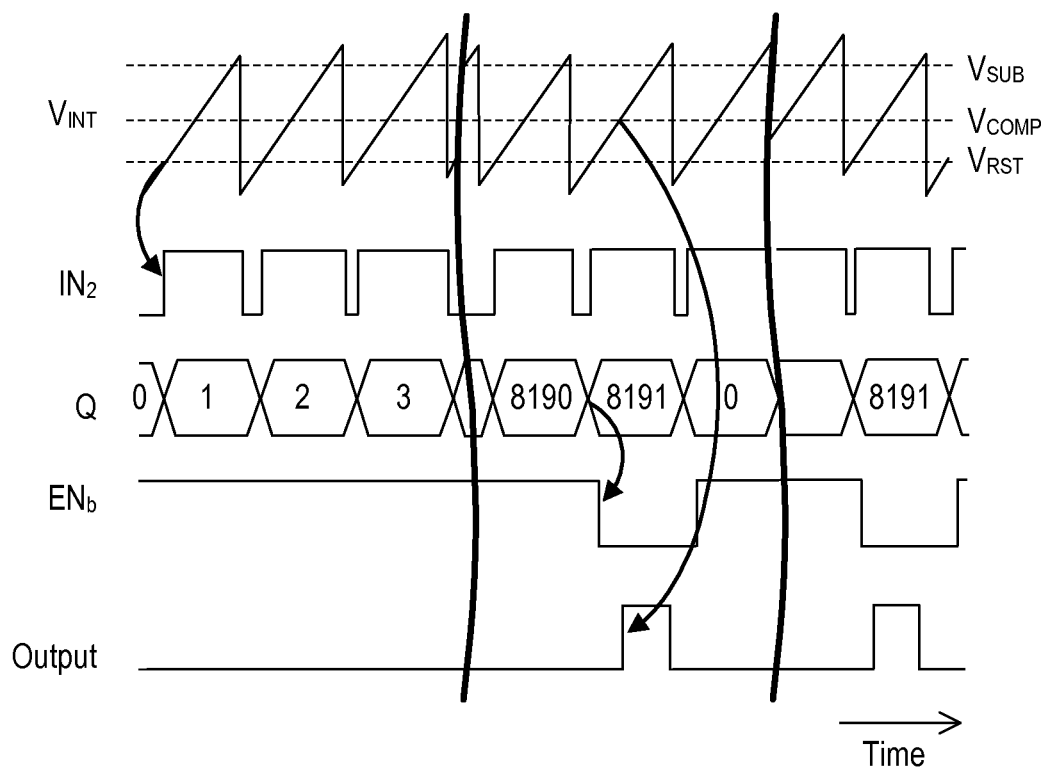
FIG. 7B is a timing diagram illustrating operation of the wake-up signal generator in FIG. 7A.

FIG. 7A depicts an example programmable wake-up signal generator. In the wake-up signal generator, a 2-stage op-amp serves as an accurate continuous comparator. With 25 nA current consumption, comparator delay is kept <0.1% of the period in the targeted temperature range. Power gating is controlled by a 16-bit programmable counter to activate the comparator only in the last cycle before wakeup. The comparator is activated just before wakeup and disabled after subtraction to prevent output glitching. With reference to FIG. 7B, the timing diagram shows generation of a wake-up signal (ENb) with 13-bit counter configuration.

The description of the embodiments herein has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A low power oscillator, comprising:
   an integrating capacitor;
   a current source configured to charge the integrating capacitor;
   a subtraction circuit electrically coupled to the integrating capacitor and operable to subtract a fixed amount of charge from the integrating capacitor in response to a trigger signal, wherein the current source continues to charge the integrating capacitor while the subtraction circuit subtracts the fixed amount of charge from the integrating capacitor; and
   a first comparator configured to receive voltage across the integrating capacitor and compare the capacitor voltage to a first reference voltage, wherein the first comparator provides a trigger signal to the subtraction circuit when the integrating capacitor voltage exceeds the first reference voltage.

2. The low power oscillator of claim 1 further comprises:
   a control circuit counts occurrences of the trigger signal generated by the first comparator and generates an activation signal when the number of occurrences equals a predefined number of cycles; and
   a second comparator configured to receive voltage across the integrating capacitor and, in response to the activation signal, compares the capacitor voltage to a second reference voltage and outputs a pulse when the capacitor voltage exceeds the second reference voltage.

3. The low power oscillator of claim 2 wherein the output from the second comparator forms a periodic oscillating signal having a frequency based on the predefined number of cycles.

4. The low power oscillator of claim 2 wherein the control circuit deactivates the second comparator after the pulse is output by the second comparator.

5. The low power oscillator of claim 1 wherein the subtraction circuit includes a charging capacitor that selectively couples to the integrating capacitor, wherein the charging capacitor is electrically coupled via an amplifier to the integrating capacitor while the subtraction circuit subtracts the fixed amount of charge from the integrating capacitor but is otherwise electrically isolated from the integrating capacitor.

6. The low power oscillator of claim 1 wherein the subtraction circuit includes
a charging capacitor;
a voltage source electrically coupled via a charging amplifier to charge the charging capacitor and operable to charge the charging capacitor; and
a subtraction amplifier electrically coupled between the charging capacitor and integrating capacitor and operable to discharge voltage from the charging capacitor to the integrating capacitor.

7. A low power oscillator, comprising:
an integrating capacitor;
a current source configured to charge the integrating capacitor;
a subtraction circuit electrically coupled to the integrating capacitor and operable to subtract a fixed amount of charge from the integrating capacitor in response to a trigger signal;
a first comparator configured to receive voltage across the integrating capacitor and compare the capacitor voltage to a first reference voltage, wherein the first comparator provides a trigger signal to the subtraction circuit when the integrating capacitor voltage exceeds the first reference voltage;
a control circuit counts occurrences of the trigger signal generated by the first comparator and generates an activation signal when the number of occurrences equals a predefined number of cycles; and
a second comparator configured to receive voltage across the integrating capacitor and, in response to the activation signal, compares the capacitor voltage to a second reference voltage and outputs a pulse when the capacitor voltage exceeds the second reference voltage.

8. The low power oscillator of claim 7 wherein the output from the second comparator forms a periodic oscillating signal having a frequency based on the predefined number of cycles.

9. The low power oscillator of claim 8 wherein the current source continues to charge the integrating capacitor while the subtraction circuit subtracts the fixed amount of charge from the integrating capacitor.

10. The low power oscillator of claim 9 wherein the control circuit deactivates the second comparator after the pulse is output by the second comparator.

11. The low power oscillator of claim 10 wherein the subtraction circuit includes a charging capacitor that selectively couples to the integrating capacitor, wherein the charging capacitor is electrically coupled via an amplifier to the integrating capacitor while the subtraction circuit subtracts the fixed amount of charge from the integrating capacitor but is otherwise electrically isolated from the integrating capacitor.

12. The low power oscillator of claim 11 wherein the subtraction circuit includes
a charging capacitor;
a voltage source electrically coupled via a charging amplifier to charge the charging capacitor and operable to charge the charging capacitor; and
a subtraction amplifier electrically coupled between the charging capacitor and integrating capacitor and operable to discharge voltage from the charging capacitor to the integrating capacitor.

13. A method for generating a periodic oscillating signal, comprising:
(a) charging an integrating capacitor using a current source;
(b) comparing voltage across the capacitor to a first reference voltage using a first comparator circuit;
(c) subtracting a fixed amount of charge from the integrating capacitor while continuing to charge the integrating capacitor, the subtraction occurring in response to the voltage across the integrating capacitor exceeding the first reference voltage;
(d) incrementing a counter;
repeating steps (a)-(d) for a predefined number of cycles;
activating a second comparator circuit, the activation occurring in response to value of the counter value equaling the predefined number of cycles;
comparing voltage across the integrating capacitor to a second reference voltage using the second comparator circuit; and
generating a pulse by the second comparator circuit, the generation occurring in response to the voltage across the integrating capacitor exceeding the second reference voltage.

14. The method of claim 13 further comprises deactivating the second comparator circuit after the pulse is output by the second comparator circuit.

15. The method of claim 13 further comprises initializing the counter to zero and continuing with execution of step (a) after the step of generating a pulse.

16. The method of claim 13 further comprises subtracting a fixed amount of charge using a subtraction circuit, where the subtraction circuit includes a charging capacitor that selectively couples to the integrating capacitor and the charging capacitor is electrically coupled via an amplifier to the integrating capacitor while the subtraction circuit subtracts the fixed amount of charge from the integrating capacitor but is otherwise electrically isolated from the integrating capacitor.

17. A low power oscillator, comprising:
an integrating capacitor;
a current source configured to charge the integrating capacitor;
a subtraction circuit electrically coupled to the integrating capacitor and operable to subtract a fixed amount of charge from the integrating capacitor in response to a trigger signal; and
a first comparator configured to receive voltage across the integrating capacitor and compare the capacitor voltage to a first reference voltage, wherein the first comparator provides a trigger signal to the subtraction circuit when the integrating capacitor voltage exceeds the first reference voltage, wherein the subtraction circuit includes a charging capacitor that selectively couples to the integrating capacitor, wherein the charging capacitor is electrically coupled via an amplifier to the integrating capacitor while the subtraction circuit subtracts the fixed amount of charge from the integrating capacitor but is otherwise electrically isolated from the integrating capacitor.

* * * * *